United States Patent
Goldman et al.

(10) Patent No.: US 7,304,889 B2
(45) Date of Patent: Dec. 4, 2007

(54) SERIALLY SENSING THE OUTPUT OF MULTILEVEL CELL ARRAYS

(75) Inventors: Matthew Goldman, Folsom, CA (US); Balaji Srinivasan, Fair Oaks, CA (US); Hernan Castro, Shingle Springs, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/493,060

(22) Filed: Jul. 26, 2006

(65) Prior Publication Data

US 2006/0262620 A1    Nov. 23, 2006

Related U.S. Application Data

(62) Division of application No. 11/196,026, filed on Aug. 3, 2005, now Pat. No. 7,106,626, which is a division of application No. 10/147,557, filed on May 17, 2002, now abandoned.

(51) Int. Cl.
*G11C 11/34* (2006.01)

(52) U.S. Cl. .......................... 365/185.03; 365/185.21; 365/194; 365/207

(58) Field of Classification Search ....... 365/185.03 O, 365/185.18, 185.21 X, 189.02, 189.05, 189.07, 365/194 X, 207 X, 185.03, 185.21, 194, 365/207
See application file for complete search history.

(56) References Cited

U.S. PATENT DOCUMENTS 5,828,616 A * 10/1998 Bauer et al. ................. 365/210
6,292,395 B1 * 9/2001 Lin .......................... 365/185.2

* cited by examiner

*Primary Examiner*—VanThu Nguyen
(74) *Attorney, Agent, or Firm*—Trop, Pruner & Hu, P.C.

(57) ABSTRACT

A serial sensing scheme may be utilized to sense the information stored on a multilevel cell. The more significant bit of the information in the cell may sense initially. The more significant bit information may be used to determine which of at least two reference levels to utilize to determine a less significant bit of the cell.

6 Claims, 6 Drawing Sheets

SERIALLY SENSING THE OUTPUT OF MULTILEVEL CELL ARRAYS

CROSS-REFERENCE TO RELATED APPLICATIONS

This application is a divisional of U.S. patent application Ser. No. 11/196,026, filed on Aug. 3, 2005 now U.S. Pat. No. 7,106,626, which is a divisional of U.S. patent application Ser. No. 10/147,557, filed on May 17, 2002 and now abandoned.

BACKGROUND

This invention relates generally to serially sensing the output of multilevel flash memories.

Data is read from a nonvolatile memory by comparing a voltage or current generated from the stored data with a reference voltage or current. In the case of a multilevel cell, the process of reading data involves comparing the voltage or current generated from the data to a series of references in order to determine the position of the generated voltage relative to the references.

Conventionally, the sensing scheme for reading data from multilevel cells involves using one sense amplifier for each reference level. This approach may be called parallel sensing. In contrast, in serial sensing, a single sense amplifier may be utilized to sense the multilevel cell. This has the advantage of reducing the amount of silicon area used for sensing circuitry by a factor of N where N is the number of reference voltages. In addition, the serial sense scheme matches the load on the cell dependent voltage or current with the load on the references. In contrast, in the parallel sense scheme, the cell dependent voltage or current has N sense amplifier loads while each reference has only one sense amplifier load. This mismatch can create offsets in the amplification that may necessitate additional circuitry or may call for greater differential margin.

In view of the advantages of serial sensing, there is a need for better ways to implement serial sensing in multilevel memory cells.

DETAILED DESCRIPTION

Figure 1:
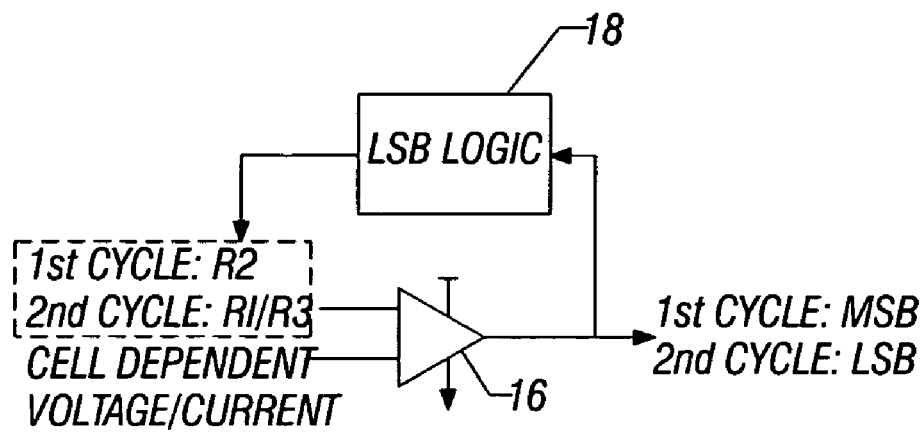
FIG. 1 is a schematic depiction of a serial sense scheme in accordance with one embodiment of the present invention.

Referring to FIG. 1, a serial sensing scheme includes a single sense amplifier 16 for a multilevel cell having two bits per cell. In general, when evaluating data stored in memory, the data is compared to a reference in order to determine whether that data is a binary '1' or a binary '0'. In a two bit sensing scheme, the output of the data evaluation will take on one of four levels—[0,0], [0,1], [1,0] or [1,1]. The present invention is not limited to any particular number of bits per cell in multilevel memory cells. While generally multilevel cells may be utilized in association with flash memories, the present invention is not so limited.

In FIG. 1, during a first cycle, the mid-point voltage or current reference of three reference levels is one input to the sense amplifier 16. In a two bit example, the mid-point reference two is between the levels corresponding to [0,1] and [1,0] outputs from the sensed cells. A cell dependent voltage or current from an array cell holding random data is fed to the other input of the sense amplifier 16. The output of the sense operation is the more significant bit (MSB) data for the cell being sensed. The serial sense scheme uses the output of the first sense operation (i.e., the MSB) to decide what reference to use for the second sensing operation for the same cell dependent voltage or current.

In particular, if the more significant bit is a zero, then the reference level used for the second sensing operation is the reference three. The reference level three is between the [0,0] and [0,1] outputs from the sensed cells. Thus, as shown in FIG. 1, the output of the sense amplifier 16 is fed back through the less significant bit (LSB) logic 18 to select, in the second cycle, whether to input either the reference level one or the reference level three to the upper input terminal of the sense amplifier 16. If the most significant bit is a one, then the reference level used for the second sensing operation is the reference one. The reference one is between the [1,0] and [1,1] outputs of the sensed cells.

In some embodiments, one may simply cycle through the various reference levels from top to bottom or from bottom to top. However, in some embodiments, such sequential search techniques may take substantially longer to reach a solution than the binomial search algorithm illustrated in FIG. 2.

Figure 2:
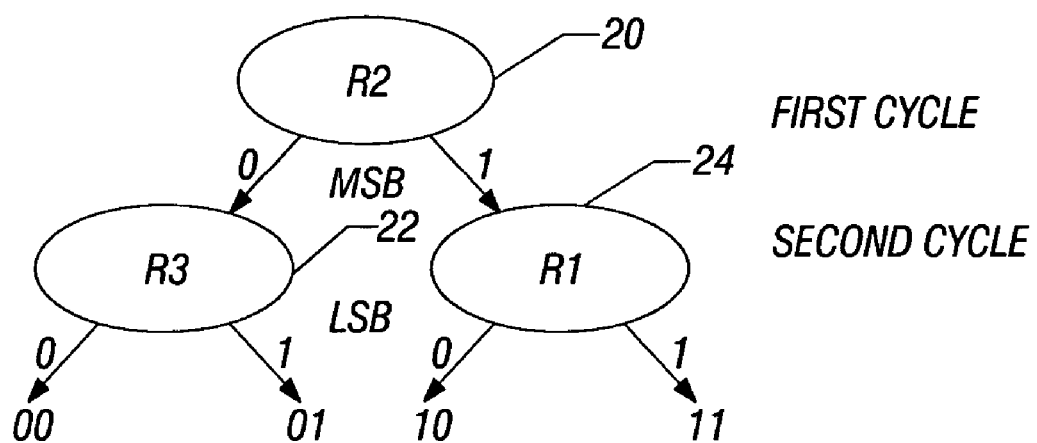
FIG. 2 is an optimized serial sense algorithm in accordance with the prior art.

Referring to FIG. 2, initially the reference two is applied to the upper terminal of the sense amplifier 16 as indicated at 20. If the more significant bit is a zero, then the reference level three is applied to the sense amplifier 16 in the second cycle as indicated at 22. Conversely, if the more significant bit is a one, then the reference level one is applied in the second cycle, as indicated at 24. Then, the next comparison may result in a zero, in which case the output is [1,0], or one in which case the output is [1,1]. Similarly, in an embodiment in which the reference level three is applied in the second cycle, as indicated at 22, the output is either [0,0] or [0,1].

Figure 3:
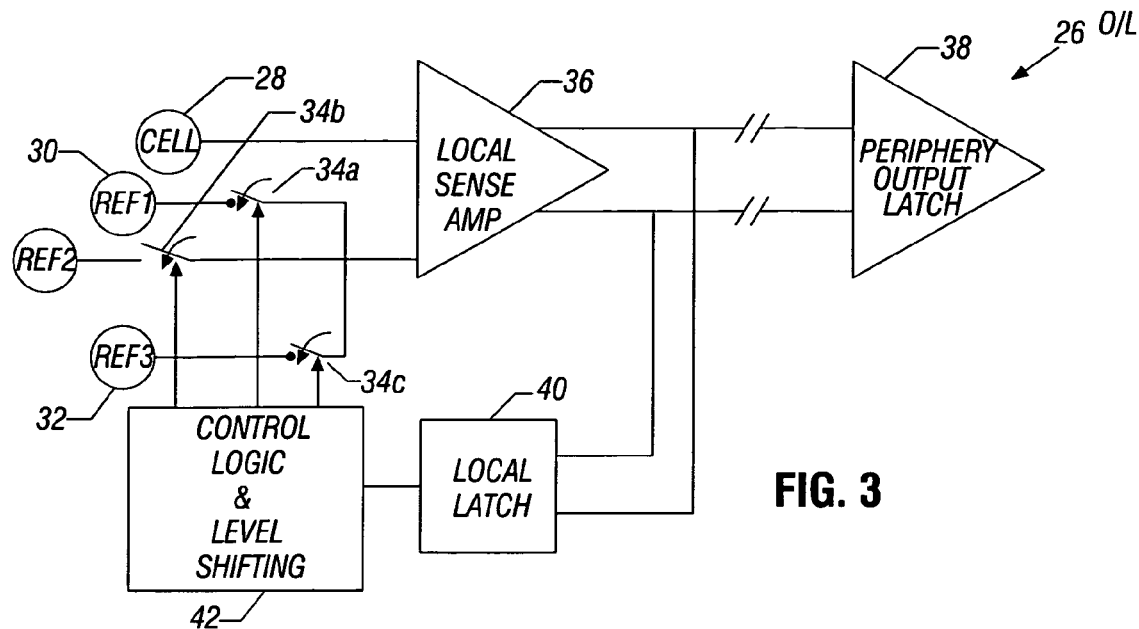
FIG. 3 is a depiction of a latching mechanism for a serial sense scheme in accordance with one embodiment of the present invention.

FIG. 3 shows a more detailed embodiment of the less significant bit logic 18. In accordance with one embodiment of the present invention, the local sense amplifier 36 is coupled to an array cell 28 and to a reference cell 30 or 32, chosen based on the data stored in a local latch 40. The local latch 40 is coupled to the output of the local sense amplifier 36 between the local sense amplifier 36 and the peripheral output latch 38.

In the parallel local latch embodiment shown in FIG. 3, the periphery output latch 38 and the local latch 40 are both driven by the same local sense amplifier 36 output. In addition, the control logic and voltage level shifting 42 converts the latch data into two separate control signals to choose between the reference one indicated at 30 and the reference three indicated at 32. More particularly, the control logic and level shifting 42 closes one of the switches 34a and 34c and opens the other of the two switches 34 to provide the appropriate reference to the local sense amplifier 36.

Figure 4:
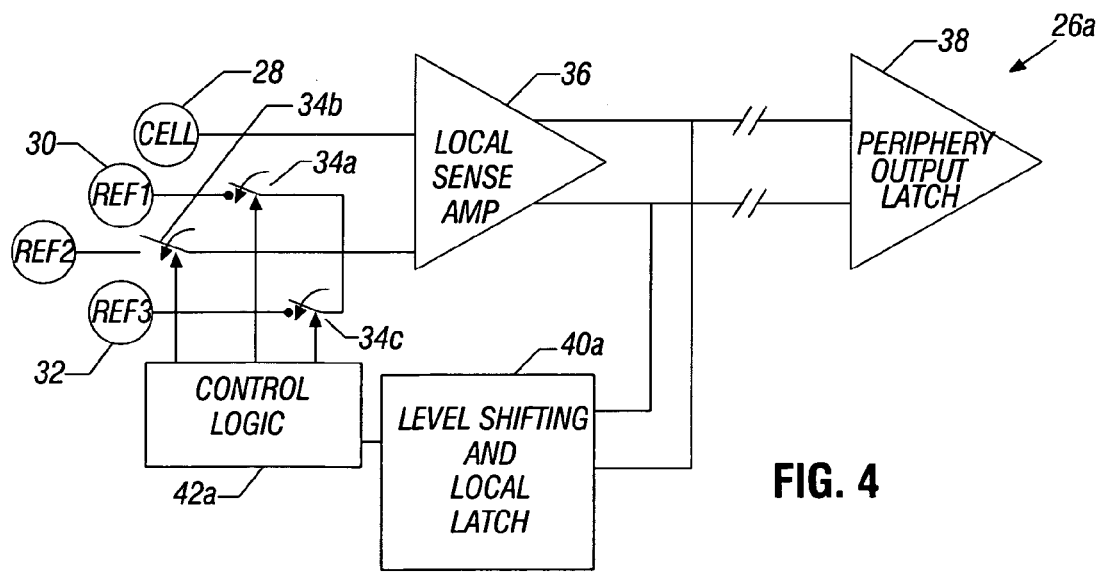
FIG. 4 is a depiction of a latching mechanism in accordance with another embodiment of the present invention.

Referring next to FIG. 4, in accordance with another embodiment of the present invention, the level shifting function that drives a switch 34a or 34c and selects the one of two references 30 or 32 may be incorporated directly into the local latch 40a. This may eliminate one operation in the feedback path, in accordance with some embodiments, at the expense of forcing the control logic and level shifting 42a to be at the same raised voltage level as the output from the local latch 40a. Otherwise the embodiment of FIG. 4 is similar to the embodiment of FIG. 3.

Figure 5:
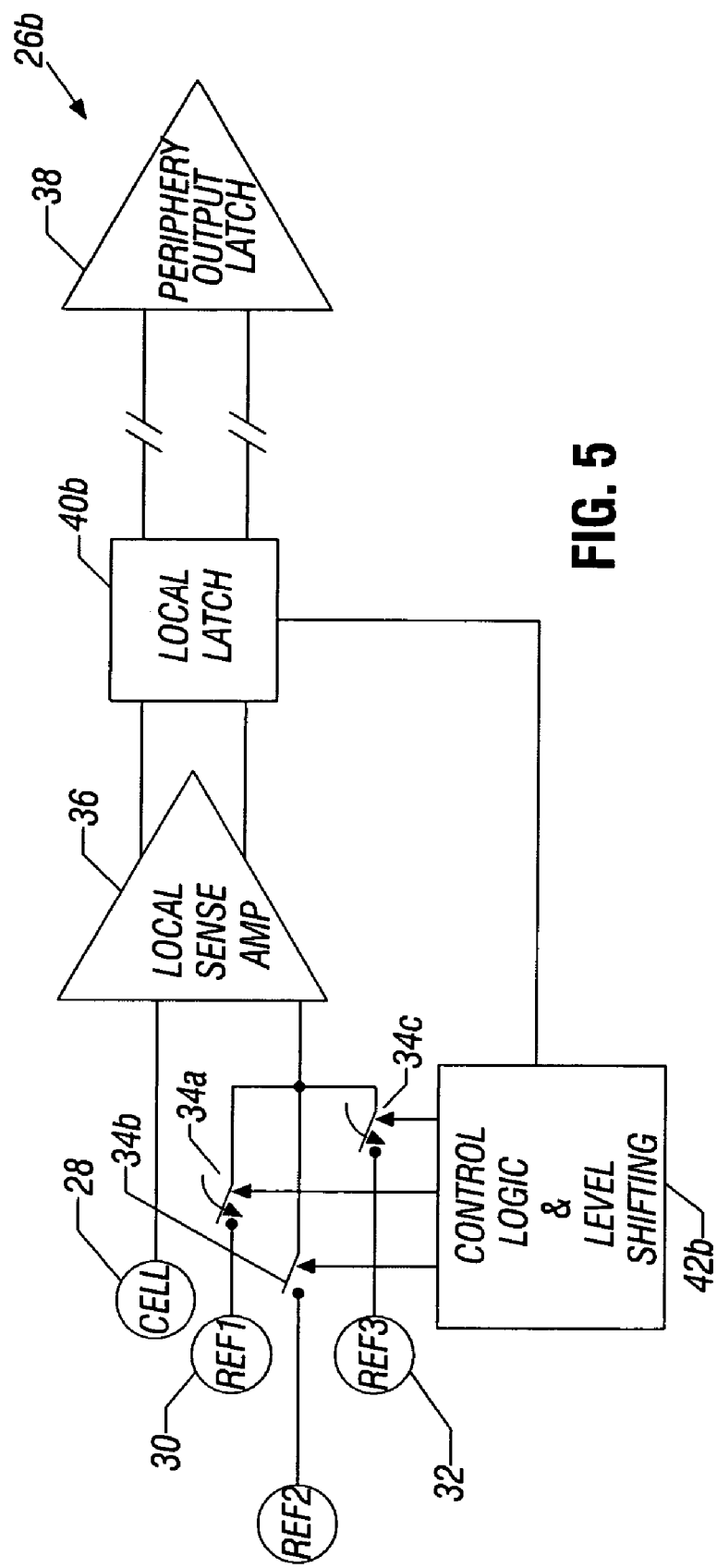
FIG. 5 is a schematic depiction of a latching scheme in accordance with still another embodiment of the present invention.

Referring next to FIG. 5, in accordance with another embodiment of the present invention, the local latch 40b may be placed between the local sense amplifier 36 and the periphery output latch 38. This implementation matches the output latch 38 data with the data fed back to the control logic and level shifting 42b to control the less significant bit reference selection. This matching may be important when validating the programming of a cell 28 with a threshold very close to the midpoint reference two, in some embodiments.

Figure 6:
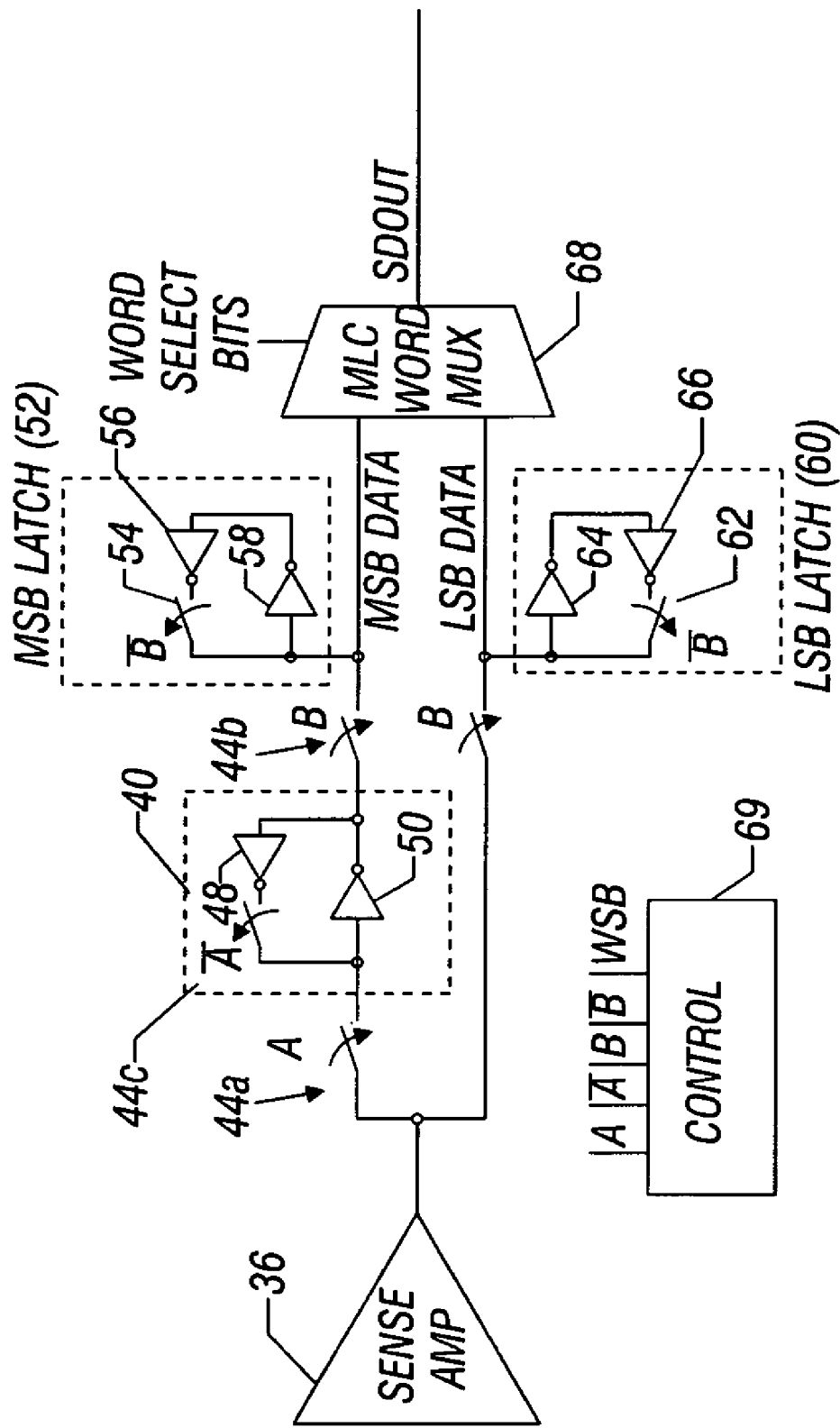
FIG. 6 is a schematic depiction of another embodiment of the present invention.

Referring next to FIG. 6, a sense amplifier 36 is coupled to a multilevel cell word multiplexer (MUX) 68. The sense amplifier 36 may correspond to any serial sensing scheme including one of the sense amplifier arrangements shown in FIGS. 1, 3, 4 or 5.

During the first or MSB sensing operation, the switch 44a is closed and the switches 44b are opened. The switch 44c is also opened. The more significant bit data may then be transferred to the intermediate latch 40. After the more significant bit sensing is complete, the switch 44a is opened capturing the more significant bit data in the intermediate latch 40 with the switch 44b still open and the switch 44c closed.

At this point, the less significant bit data can be sensed without disturbing the more significant bit data. Once the less significant bit data has been sensed, the switch 44b is closed (the switch 44a remains open) and the switches 54 and 62 are opened. As a result, both the more significant bit and less significant bit data are transferred to a second set of latches 52 and 60, respectively. Thereafter, the switches 54 and 62 are closed just before (or at least simultaneously with) opening the switch 44b making the data available to the inputs of the MLC word multiplexer 68. Data is captured in the latches 52 and 60 prior to being disconnected from the latches 40 and sense amplifier 36. At this point, a subsequent MSB and LSB sense operation can be undertaken without disturbing the data from the previous sensing sequence while simultaneously driving the prior data through the multiplexer.

Sequencing of the sets of latches 40, 52 and 60 can be entirely controlled by a single pulse indicating that the more significant bit sensing is occurring. That is, when the more significant bit sensing is ongoing, the switch 44a is closed and the switch 44b is opened. When the more significant bit sensing is complete, the switch 44a is opened and the switch 44b is closed.

For a synchronous burst, the switch 44b may be controlled independently via the system clock to ensure that the second set of less significant bit data does not overwrite the first or more significant bit data. In a synchronous burst, multiple words are read at the same time, such that each word can be clocked out without having to wait an additional sensing interval for each word after the first word.

A multilevel cell memory can have a continuous burst capability using serial sensing in some embodiments. A continuous burst is an ongoing synchronous burst where the sense circuitry reads the next batch of words while a prior batch is being parsed.

For example, in order to use ×64 multilevel cell sensing architecture in burst operation, it is advantageous to capture, in sequence, 256 bits of data. Since the sense circuits provide 64 bits of data at once, 192 latches are employed to hold the rest of the data. Thus, in the embodiment shown, 64 bits may be resident in the sense amplifiers 36 and 64 bits may be resident in the latches 40, 56, and 60, respectively. The output of the multiplexer 68, controlled by word select bits, includes both the more and less significant bits.

The intermediate latch 40 includes a pair of inverters 48 and 50. The intermediate latch 40 has a switch 44c controlled by the inverse of the signal that controls the switch 44a. Similarly, the latch 52 includes a switch 54 and a pair of inverters 56 and 58. The state of the switch 54 is the opposite the state of the switch 44b. The state of the switch 62 is the opposite of the state of the switches 44b. The latch 60 also includes inverters 64 and 66. The switches 44c, 54 and 62 control the output of their respective latches. Thus, the more significant bit data goes to the upper input of the multiplexer 68 and the least significant bit data goes to the lower input of the multiplexer 68 wherein the data is combined.

Figure 7:
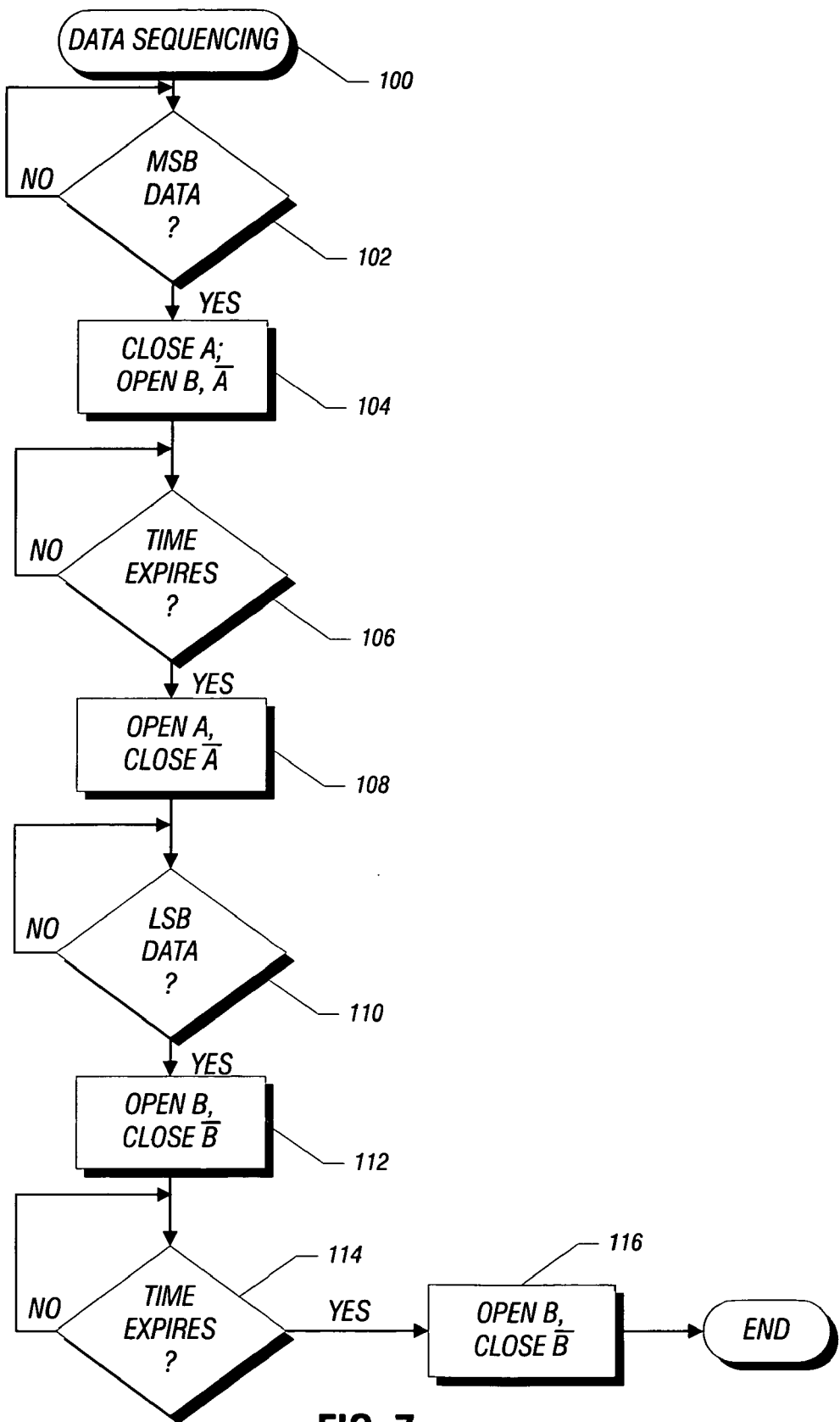
FIG. 7 is a flow chart for the embodiment shown in FIG. 6 in accordance with one embodiment of the present invention.

Referring to FIGS. 6 and 7, a control 69 outputs the signals A, $\overline{A}$, B, and $\overline{B}$ which go to the switches 44a, 44c, 44b, 54 and 62 as indicated in FIG. 6. The control 69 may also issue the word select bits (WSB) that control the multiplexer 68. The control 69 may be implemented in hardware, software or firmware.

Referring to FIG. 7, in accordance with one embodiment of the present invention, the control 69 implements a data sequencing flow 100 that initially determines whether more significant bit data has been sensed, as determined at 102. If so, the signal A is activated to close its respective switch and the signals B, $\overline{A}$ are activated to open switches, all as indicated in block 104.

In one embodiment of the present invention, a check at diamond 106 determines whether a time period has expired. The available time may be a time sufficient to capture the most significant bit data in the latch 40 in one embodiment. Other techniques may also be utilized to determine when to proceed.

Once time has expired, as determined in diamond 106, the signal A is operated to open its corresponding switch and the signal $\overline{A}$ is operated to close its corresponding switches, as indicated in block 108. Next, a check at diamond 110 determines whether the less significant bit data has been sensed. If so, the signal B is operated to close its corresponding switches and the signal $\overline{B}$ is operated to open its corresponding switches as indicated in block 112.

A check at diamond 114 determines whether a time expiration has occurred. Again the time expiration may indicate a time sufficient to enable the less significant data to be latched in the latch 60. Other techniques may be utilized as well.

In one embodiment, once the time expires, the signal B may be operated to open its corresponding switches and the signal $\overline{B}$ may be operated to close its corresponding switches as indicated in block 116.

Figure 8:
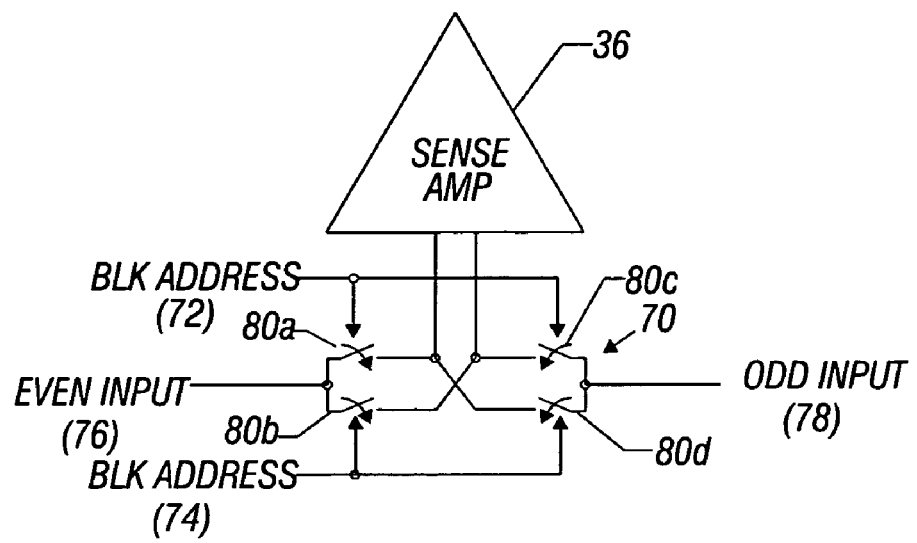
FIG. 8 is a schematic depiction of another embodiment of the present invention.

Referring to FIG. 8, a scheme for coupling a sense amplifier 26 to an array cell and one or more reference cells may reduce coupled noise effects in accordance with one embodiment. One member of a twisted bitline pair may be coupled to an array cell while the other member of the bitline pair may be coupled to a reference cell. To balance the loading seen at the inputs of the sense amplifier 36, the array cell may be coupled to one bitline for even blocks and the other bitline for odd blocks. Thus, the lowest significant bit of the block decode may be used to determine which side of the sense amplifier 36 is tied to the array and which side is tied to the reference cell, in one embodiment of the present invention.

Given this configuration, any system noise that impacts the bitlines appears as common mode noise to the sense amplifier (common mode noise is rejected). As a consequence of the twisting, the polarity of the output of the sense amplifier is dependent not only on the relative values of the array and reference data but also on which cell is connected to which side of the amplifier. Without the block decoded descrambling technique shown in FIG. 8, the polarity of the output from the sense amplifier would be unknown making it impossible to determine the correct value of the MSB sense access (which is then used to choose the appropriate reference for the LSB access). With some embodiments of the present invention, the selection of the correct reference for the LSB sensing may be implemented using the block address.

The block address 72 may be used to directly choose which side of the sense amplifier 36 to connect to the array and which side to connect to the reference in one embodiment. The block address 72 and $\overline{\text{block address}}$ 74 may be coupled to a switching network 70 including the switches 80a and 80b coupled to the even input 76 and the switches 80c and 80d coupled to the odd input 78. Depending on the state of the switches 80, either the odd input 78 or the even input 76 is coupled to the sense amplifier 36 under control of the block address. The polarity of the output from the sense amplifier 36 is the same regardless of which bitline is coupled to which cell.

Figure 9:
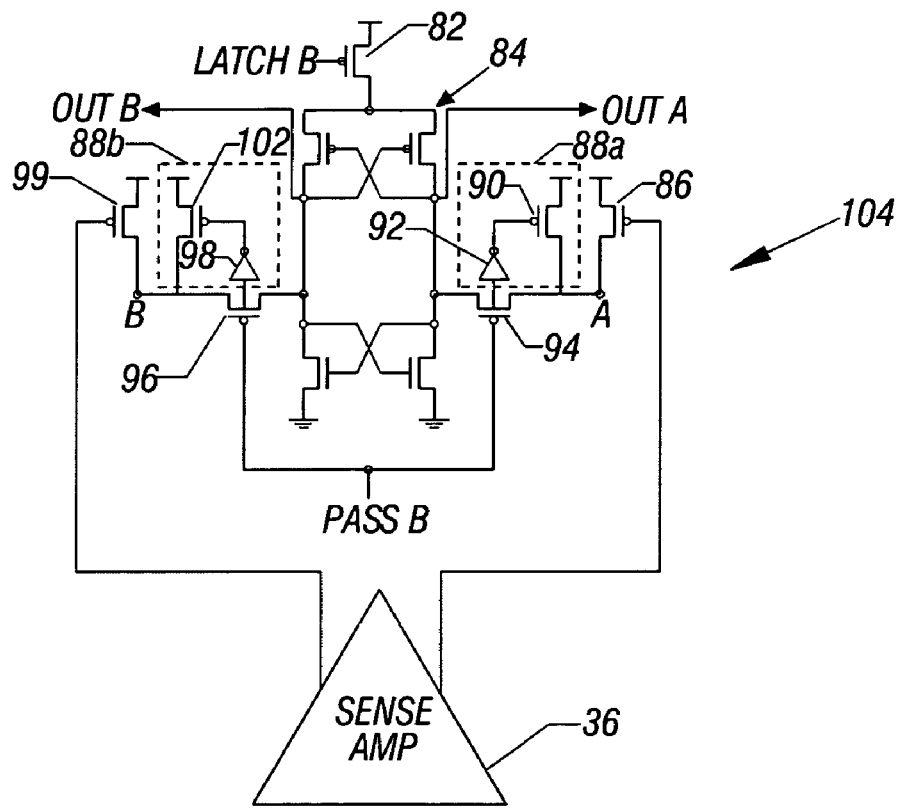
FIG. 9 is a schematic depiction of another embodiment of the present invention.

Referring to FIG. 9, an isolation circuit 104 may control the provision of a signal from the sense amplifier 36 to a local latch, such as the latch 40, 40a or 40b of FIGS. 3-5, coupled through the signal outputs A (OUT A) and B (OUT B). The circuit 104 reduces data dependencies that arise from charge stored on nodes A and B.

First and second outputs from the sense amplifier 36 are coupled to the gates of the PMOS transistors or drivers 99 and 86. The drivers 99 and 86 are the drivers from the sense amplifier 36 to a local latch, such as the latch 40 shown in FIG. 3 and coupled to OUT A and OUT B. One terminal of the transistor 99 is coupled to the node B and one terminal of the transistor 86 is coupled to the node A. Also coupled to the node B is a PMOS transistor or pass gate 96 that receives the signal pass B on its gate. Also coupled to the node A is a PMOS transistor or pass gate 94 that also receives the signal pass B on its gate. The gates 94 and 96 control when data is passed between the amplifier 36 and the latch.

The signal pass B is also coupled to a pair of inverters 98 and 92 that are part of circuits 88b and 88a, respectively. A transistor 102 is coupled to the inverter 98 and a transistor 90 coupled to the inverter 92. The transistor 102 is parallel to the transistor 99 and the transistor 90 is parallel to the transistor 86. In one embodiment the transistors 90 and 102 are PMOS transistors.

Finally, the transistors 96 and 94 are coupled to a differential amplifier 84 having outputs OUT B and OUT A as indicated. The differential amplifier 84 is coupled to a PMOS transistor 82 that receives a signal latch B on its gate.

The transistor 86 acts as a PMOS driver and the transistor 94 acts as a PMOS pass gate. In normal operation, when the transistors 96 and 94 are turned on because the signal pass B is zero, one of the transistors 99 and 86 is turned on and the other is turned off by the complementary outputs from the sense amplifier 36. After a period of time, when data has stabilized, latch B is set to zero to hold the data in the local latch 84. The transistors 94 and 96 are also turned off by the signal pass B equal to one to allow the sense amplifier 36 to move on to the less significant bit (LSB) sensing.

One problem that arises is that the nodes A and B are left floating when transistors 96 and 94 are turned off. The inverters 92 and 98 and the devices 90 and 102 form pre-charge circuits to reduce or eliminate the data dependency due to stored charge at nodes A and B.

If the left side transistor 99 was driven low and the right side transistor 86 was driven high, the node B stays near the supply voltage and the node A stays near ground, after the transistors 94 and 96 are turned off. As a result, during the next sensing operation, the capacitive loading seen at the nodes A and B is data dependent, improperly impacting the sensing operation.

In one embodiment, the nodes A and B are precharged to the supply voltage whenever the respective transistors 94 and 96 are opened. Small pull-up transistors 102 and 90 may be placed in parallel with the transistors 99 and 86. Each pull-up transistor 102 or 90 is controlled by the inverted pass B signal. Then, both nodes A and B are maintained at voltage supply level whenever the circuit 104 is being used. Thus, the local latch 40 does not corrupt the sensing process by placing a nonsymmetrical load on the outputs of a sense amplifier.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A multilevel memory cell comprising:
   a sense amplifier;
   a circuit coupled to the output of said sense amplifier;
   a latch coupled to said circuit; and
   said circuit including a driver coupled to a pass gate, said driver coupled to an output of said sense amplifier, and said pass gate coupled to said latch, said circuit further including a pull-up transistor coupled between said driver and pass gate to charge a node between said driver and said pass gate when said pass gate is turned off.

2. The memory of claim 1, said driver and said pass gate coupled to a first output of said sense amplifier, and a second driver and second pass gate coupled to the second output of said sense amplifier.

3. The memory of claim 2 wherein said pull-up transistor has a gate coupled to an inverter, said inverter coupled to a signal also coupled to the gate of said pass gates.

4. The memory of claim 3 wherein said drivers, pass gates, and pull-up transistors are PMOS transistors.

5. A method comprising:
   providing an output from an array cell to a first input of a sense amplifier;
   feeding the output of the sense amplifier to a latch through a driver coupled to a pass gate;

coupling a first output of the sense amplifier through a first driver and pass gate and coupling a second output of said sense amplifier through a second driver and pass gate to said latch; and biasing the node between each pass gate and driver.

6. The method of claim 5 wherein said nodes are selectively biased when the pass gates are turned off.

* * * * *